(12) United States Patent
Osabe et al.

(10) Patent No.: US 7,045,853 B2
(45) Date of Patent: May 16, 2006

(54) SEMICONDUCTOR MEMORY ELEMENT, SEMICONDUCTOR DEVICE AND CONTROL METHOD THEREOF

(75) Inventors: Taro Osabe, Kokubunji (JP); Tomoyuki Ishii, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/957,680

(22) Filed: Oct. 5, 2004

(65) Prior Publication Data

US 2005/0056884 A1    Mar. 17, 2005

Related U.S. Application Data

(62) Division of application No. 10/082,205, filed on Feb. 26, 2002, now Pat. No. 6,815,763.

(30) Foreign Application Priority Data

Aug. 24, 2001   (JP) .............................. 2001-253887

(51) Int. Cl.
*H01L 29/788*    (2006.01)
(52) U.S. Cl. .................. 257/316; 257/317; 257/319; 257/320; 257/321; 257/324
(58) Field of Classification Search ........ 257/315–317, 257/319–321, 324
See application file for complete search history.

(56) References Cited

U.S. PATENT DOCUMENTS

| | | | |
|---|---|---|---|
| 5,408,115 A * | 4/1995 | Chang | ........................ 257/324 |
| 6,342,716 B1 | 1/2002 | Morita et al. | |
| 6,388,293 B1 | 5/2002 | Ogura et al. | |
| 6,400,610 B1 | 6/2002 | Sadd | |
| 6,586,785 B1 | 7/2003 | Flagan et al. | |

* cited by examiner

*Primary Examiner*—Thien F. Tran
(74) *Attorney, Agent, or Firm*—Antonelli, Terry, Stout and Kraus,LLP.

(57) ABSTRACT

In a semiconductor flash memory required to have high reliability, injection and extraction of electrons must be performed through an oxide film obtained by directly oxidizing a silicon substrate. Accordingly, the voltage to be used is a large voltage ranging from positive to negative one. In contrast, by storing charges in a plurality of dispersed regions, high reliability is achieved. Based on the high reliability, transfer of electrons is permitted through not only the oxide film obtained by directly thermally oxidizing a high reliability silicon substrate but also another oxide film deposited by CVD, or the like. In consequence, a device is controlled by electric potentials of the same polarity upon writing of data and upon erasing of data.

24 Claims, 13 Drawing Sheets

SEMICONDUCTOR MEMORY ELEMENT, SEMICONDUCTOR DEVICE AND CONTROL METHOD THEREOF

CROSS-REFERENCE TO RELATED APPLICATIONS

This is a Divisional application of application Ser. No. 10/082,205, filed Feb. 26, 2002 now U.S. Pat. No. 6,815,763, the entire disclosure of which is hereby incorporated by reference.

BACKGROUND OF THE INVENTION

The present invention relates to a semiconductor memory element and a semiconductor device.

In recent years, flash memories which are semiconductor nonvolatile memories have become introduced into a large number of apparatuses as the ones for storing programs or for storing data. The problem encountered with the flash memories is the price thereof. The price per capacity thereof is several or more fold higher as compared with other media such as hard disks, magneto-optic disks, and DVDs, resulting in a demand for cost reduction. The cost reduction can be achieved most effectively by a decrease in chip area. In contrast, there has been adopted in the prior art an approach of reducing the area of the memory cell. This is implemented by physically reducing the memory cell size due to miniaturization. One example of the memory cell size reduction due to miniaturization is described in H. Miwa et al. "A 140 mm$^2$ 64 Mb AND Flash Memory with A 0.4 µm Technology" IEEE, International Solid-State Circuit Conference 1996, p34–35 (1996). Alternatively, the so-called multi-level technology has come into actual use, which enables every memory cell to store two bits of information, thereby to effectually reduce the memory cell area per bit, or other approaches have been made. The prior art example of the multi-level memory is described in T. Jung et al., "A 3.3V 128 Mb Multi-Level NAND Flash Memory for Mass Storage Applications" IEEE International Solid-State Circuit Conference 1996, p32–33 (1996).

SUMMARY OF THE INVENTION

For ensuring the reliability, in a flash memory, scaling cannot be performed in the direction of thickness. Therefore, it is not possible to set the operation voltage at a lower level. Similarly, for ensuring the reliability, electron transfer must be performed through an oxide film formed by directly thermally oxidizing a silicon substrate. The oxide film is less susceptible to charge leakage. Accordingly, use of large positive and negative voltages is unavoidable. For this reason, the peripheral circuit, particularly, the power source occupies large area. As a result, the proportion of the area of the memory cells is reduced, leaving a problem that the chip area cannot be reduced even through miniaturization. The increase in cost due to a reduction in proportion of the memory cell area presents a large problem for a flash-embeded logic circuit for incorporation into an apparatus, or the like.

An object of the present invention is to provide a memory element configuration whereby the required voltages are few in kind, and the voltage is low, while ensuring the reliability. By using the memory element, it becomes possible to simplify the configurations of the peripheral circuits of a semiconductor memory device, and thereby to reduce the chip area. Namely, it becomes possible to provide a method for implementing a low cost semiconductor memory device.

The present invention is characterized in the following respects. Charges are not stored in a single region in a memory cell as in the prior art, but stored in a plurality of dispersed regions. In consequence, high reliability is implemented. The operation mode is simplified by performing electron transfer through not only the oxide film obtained by directly thermally oxidizing a high reliability silicon substrate but also another oxide film obtained from deposition by CVD (Chemical Vapor Deposition), or the like. As a result, the cost reduction of the semiconductor memory device is achieved.

More specifically, a semiconductor device in accordance with a typical embodiment of the present invention is mainly made up of semiconductor memory elements, each of which has:

a source region, a drain region, a channel region made of a semiconductor, the source region and the drain region being connected by the channel region, a gate electrode made of a metal or a semiconductor for controlling the electric potential of the channel region, and a plurality of charge storage regions in the vicinity of the channel region, wherein the electric potential to be applied to the gate electrode upon writing of data and the electric potential to be applied to the gate electrode upon erasing of data have the same polarity.

Other means, objects, and features of the present invention will become apparent from the following embodiments.

DETAILED DESCRIPTION OF THE PREFERRED EMBODIMENTS

EXAMPLE 1

Below, a semiconductor element and a semiconductor device will be described by way of specific examples of the present invention.

Figure 1:
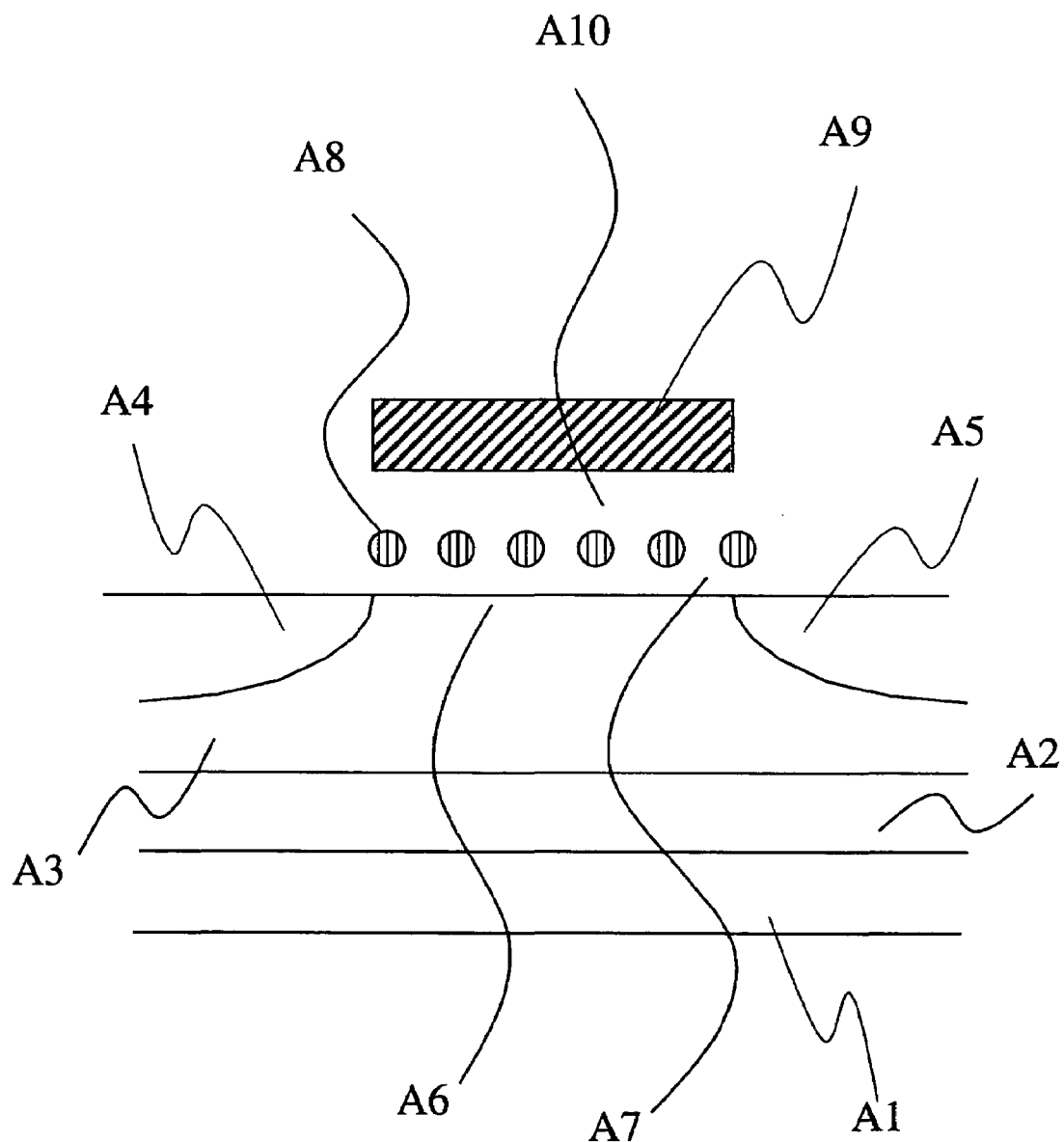
FIG. 1 shows the configuration of the cross section of a semiconductor memory element of Example 1.

FIG. 1 shows the configuration of the cross section of a memory element in accordance with this example.

The memory element has a triple-well structure in which on a P-type silicon substrate (A1), an n-type well region (A2) is disposed, and a P-type well region (A3) is further disposed therein. There are N-type source region (A4) and drain region (A5) in the P-type well (A3). A plurality of microcrystal grains (A8) with a mean size of 10 nm of silicon, serving as charge storage regions, are arranged on a channel (A6) via a 6 nm-thick insulation film (A7) made of $SiO_2$. There is disposed a gate electrode (A9) made of N-type polysilicon for controlling the electric potentials of the channel and the charge storage regions. The region between the silicon microcrystal grains (A8) and the gate electrode (A9) are constituted by an insulation film (A10) of a so-called ONO structure in which a 3 nm-thick $SiO_2$ film, 6 nm-thick $Si_3N_4$ film, and a 3 nm-thick $SiO_2$ film are stacked in this order from the lowest. Alternatively, it is also possible that the region between the silicon microcrystal grains (A8) and the gate electrode (A9) is constituted not by an insulation film of the ONO structure but by a 9 nm-thick insulation film made of $SiO_2$.

Figure 2:
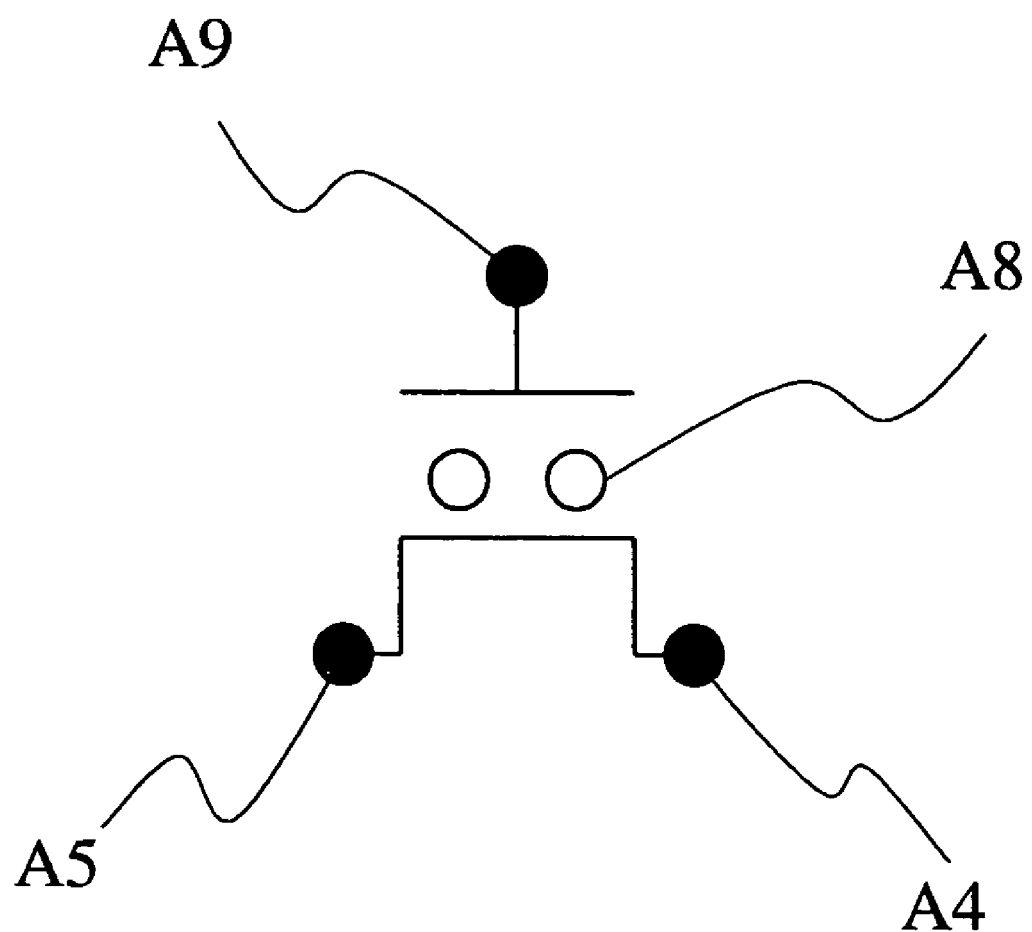
FIG. 2 is a representation on a circuit diagram corresponding to the semiconductor memory element of Example 1.

FIG. 2 shows a representation in the circuit diagram corresponding to FIG. 1. The elements are respectively assigned their corresponding numbers: gate electrode (A9), source (A4), drain (A5), and charge storage region (A8). Incidentally, the triple-well structure is demonstrated in FIG. 1, but it is omitted for avoiding the complication of the diagrams in other examples.

Then, a manufacturing process of this example will be described. After forming an isolation region and the triple-well structure (A1), (A2), and (A3), B (boron) ion implantation for controlling the threshold voltage is performed on a memory cell formation region on the P well (A3). The substrate surface is oxidized to form the 6 nm-thick $SiO_2$ film (A7). Subsequently, silicon microcrystal grains are formed by CVD (Chemical Vapor Deposition). In a prototype, the grains were formed with a mean grain size of 10 nm and a density of $5\times10^{11}$ cm$^{-2}$. On the silicon microcrystal grains (A8), an interlayer insulation film (A10) of the ONO structure in which a 3 nm-thick $SiO_2$ film, 6 nm-thick $Si_3N_4$ film, and a 3 nm-thick $SiO_2$ film are stacked in this order from the lowest is formed. Thereafter, N-type polysilicon for forming the gate electrode (A9) is deposited thereon, and a $SiO_2$ film is further deposited. By using a resist as a mask, the $SiO_2$ film, the polysilicon film, the ONO film, the silicon microcrystal grains, and the $SiO_2$ film are successively etched. In this process, the gate electrode (A9) is formed. By using the gate electrode (A9) as a mask, As (arsenic) ions are implanted thereinto, followed by activation annealing to form the source region (A4) and the drain region (A5). Further, interlayer film deposition and planarization are performed, and then, a contact step and a wiring step are performed.

Then, the operation of this example will be described.

First, the write operation will be described. Herein, the state in which a large amount of charges are injected in the charge storage regions (A8) is set to correspond to data "1", while the state in which less amount of charges are injected therein is set to correspond to data "0".

Writing of the data "1" is performed in the following manner. Namely, 0 V is applied to the source region (A4), a positive potential (ex., 5 V) to the drain region (A5), and a positive voltage pulse (ex., 5 V) to the gate electrode (A9). In consequence, channel hot electrons are generated, so that electrons are injected into the charge storage regions (A8). The following alternative is also possible. Namely, 0 V is applied to the source region (A4) and the drain region (A5), and a positive potential (ex., 18 V) is applied to the gate electrode (A9). In consequence, electrons are allowed to tunnel through the insulation film (A7), and to be injected into the charge storage regions. In this case, a larger voltage is required than with the charge injection utilizing hot electrons, and hence, unfavorably, the configurations of the peripheral circuits become complicated.

Writing of the data "0" is performed by extracting electrons from the charge storage regions (A8) to the gate electrode (A9). Specifically, 0 V is applied to the source region (A4) and the drain region (A5), and a positive potential pulse (ex., 10 V) is applied to the gate electrode (A9). In consequence, electrons are allowed to tunnel through the insulation film (A7), and to be extracted to the gate electrode (A9). Alternatively, writing of the data "0" can also be accomplished in the following manner as with a conventional flash memory. Namely, a negative voltage pulse (ex., −10 V) is applied to the gate electrode. In consequence, electrons are extracted from the charge storage regions, allowed to tunnel through the insulation film (A7), and to be attracted to the substrate. However, in this case, a negative voltage pulse must be utilized, entailing a demerit that the peripheral circuits become complicated. Incidentally, in this example, writing of the data "0" is substantially identical to erasing of the data.

A large number of operations of rewriting data equal to a large number of operations of applying a voltage stress. The accumulation of the voltage stresses causes the deterioration of the insulation film made of $SiO_2$, so that electrons become more likely to leak even at a low electric field. The degree of the degradation is more severe for the $SiO_2$ film formed by CVD than for the $SiO_2$ film formed by oxidizing the substrate. Therefore, with a conventional flash memory, a voltage stress can be applied only to an insulation film made of $SiO_2$ formed by oxidizing the substrate for rewriting data in order to store charges with stability. Namely, electron transfer must be restricted between the substrate and the charge storage region for ensuring the reliability.

In contrast, in this example, the charge storage regions are made up of a plurality of silicon microcrystal grains. Therefore, the charges stored in the silicon microcrystal grains existing on leak paths are the only ones that leak even after electrons have become susceptible to leakage at a low electric field. Most other silicon microcrystal grains are capable of holding charges with stability, and hence the whole element has a good charge retention characteristic. Therefore, even if a voltage stress is applied to the $SiO_2$ film formed by CVD susceptible to a voltage stress, in this example, it is possible to ensure the charge retention characteristic comparable to that of a conventional flash memory. Namely, electron transfer is possible not only between the substrate and the charge storage regions but also between the charge storage regions and the gate electrode.

Then, the read operation will be described. For example, 2 V is applied to the drain region, 0 V is applied to the source region, and a read pulse of 2 V is applied to the gate electrode (A9). The threshold voltage differs according to whether the amount of charges injected into the charge storage regions (A8) is large or small. Accordingly, the drain current when the data "0" is written is larger than the drain current when the data "1" is written. As a result, it is possible to distinguish between the data "0" and the data "1". Alternatively, reading can also be accomplished by interchanging the voltage relationship between the drain region and the source region like the following relationship: 0 V for the drain region, 2 V for the source region, and 2 V for the gate electrode.

The voltage relationships used for writing and reading of the data "1" and the data "0" in this example are summarized in Table 1.

TABLE 1

|  | Source voltage | Drain voltage | Gate voltage |
|---|---|---|---|
| Writing of "1" | 0 V | 5 V | 5 V |
| Writing of "0" (Data erasure) | 0 V | 0 V | 10 V |
| Reading | 0 V | 2 V | 2 V |

With a conventional flash memory, writing of the data "0" is performed in the following manner. Namely, a negative potential is applied to the gate electrode. In consequence, electrons are allowed to tunnel through the insulation film (A7), and to be extracted into the substrate. The electric potential applied to the gate is large because electrons are extracted into the substrate. Further, it is opposite in polarity to the electric potential used for writing of the data "1", and hence a power generation circuit becomes complicated, incurring not only an increase in chip size, but also an increase in cost.

In this example, writing and reading of either of the data "1" and the data "0" can be both accomplished only by applying voltages with the same polarity and almost the same magnitude. Therefore, the power generation circuit becomes simple. As a result, it becomes possible to largely reduce the area of the peripheral circuits.

EXAMPLE 2

Figure 3:
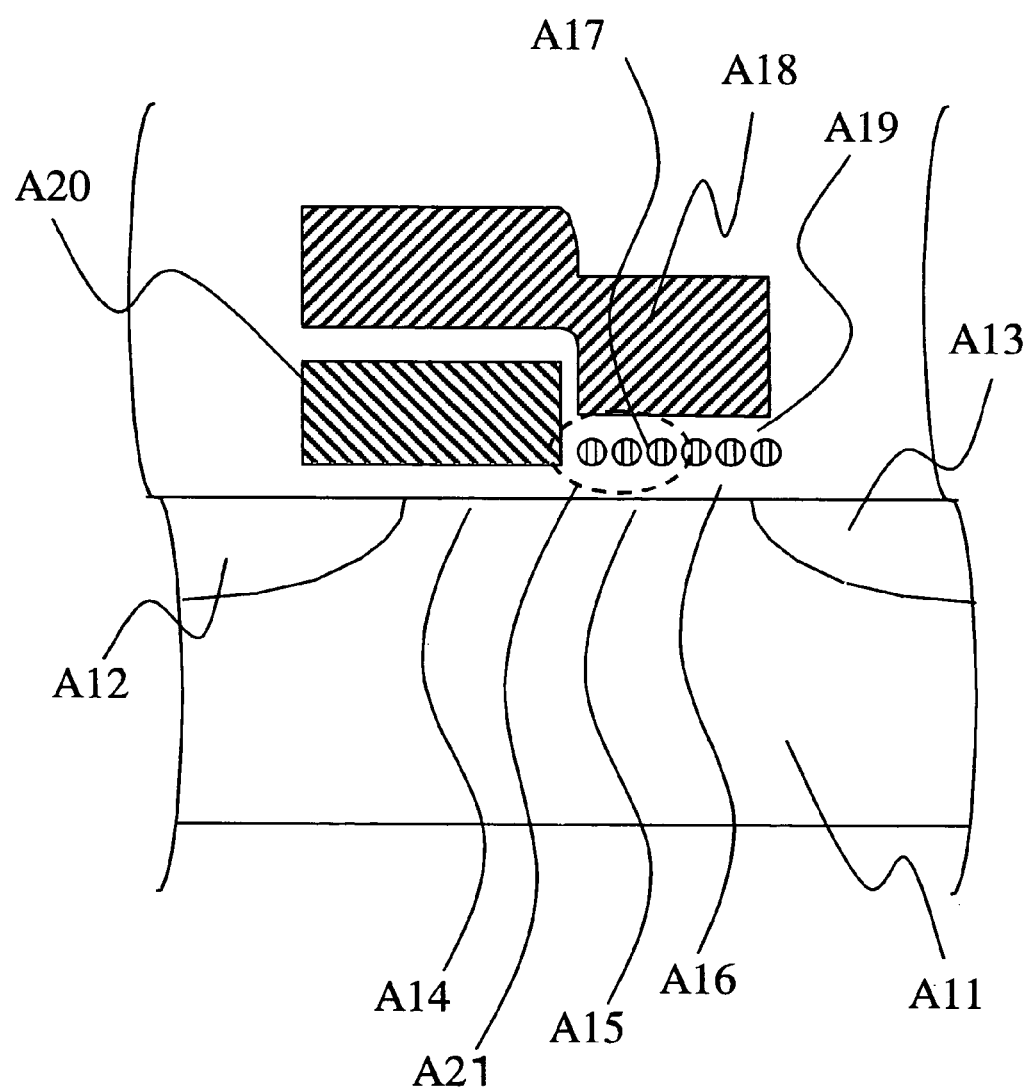
FIG. 3 is a cross sectional diagram of a semiconductor memory element of Example 2.

FIG. 3 shows the configuration of the cross section of a memory element in accordance with a second example in the present invention.

There are N-type source region (A12) and drain region (A13) disposed in a P-type well (A11). A plurality of microcrystal grains (A17) with a mean size of 10 nm of silicon, serving as charge storage regions, are arranged on channels (A14) and (A15) via a 5 nm-thick insulation film (A16). There is disposed a first gate electrode (A18) made of N-type polysilicon for controlling the electric potentials of a part of the channel (A15) and the silicon microcrystal grains (A17). The region between the silicon microcrystal grains (A17) and the first gate electrode (A18) are constituted by an insulation film (A19) of a so-called ONO structure in which a 3 nm-thick $SiO_2$ film, a 6 nm-thick $Si_3N_4$ film, and a 3 nm-thick $SiO_2$ film are stacked in this order from the lowest. Further, there is a second gate electrode (A20) for controlling the electric potential of a part of the channel region (A14).

Figure 4:
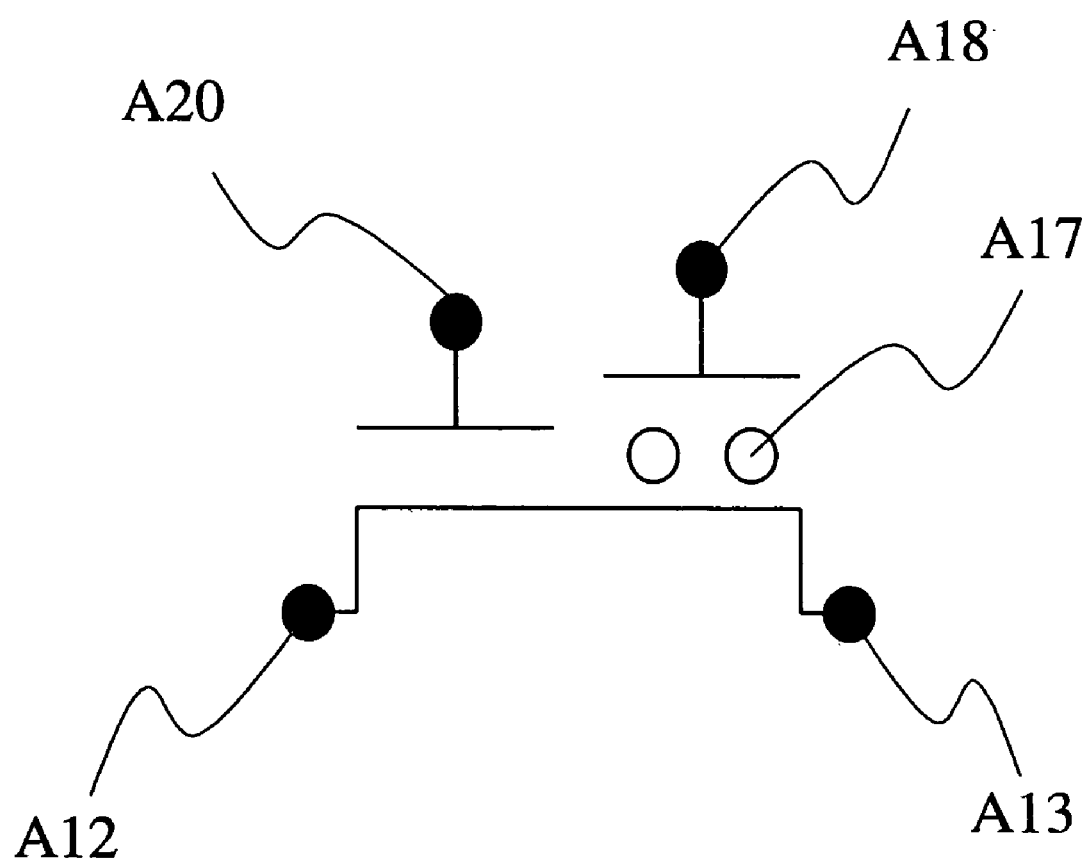
FIG. 4 is a representation on a circuit diagram corresponding to the semiconductor memory element of Example 2.

FIG. 4 shows a representation in the circuit diagram corresponding to FIG. 3. The elements are respectively assigned their corresponding numbers: first gate electrode (A18), second gate electrode (A20), source region (A12), drain region (A13), and charge storage regions (A17) made of silicon microcrystal grains.

Then, the operation of this example will be described. In this example, hot electron injection into the charge storage regions (A17) is performed with high efficiency by using the second gate electrode (A20) as an auxiliary electrode.

First, the write operation will be described. The voltage applied to the drain region (A13) is set according to the data to be written. Herein, the state in which a large amount of charges are injected therein is set to correspond to the data "1", while the state in which less amount of charges are injected therein is set to correspond to the data "0". For writing of the data "1", the drain voltage is set so as to cause an electric field enough for hot electron generation (ex., it is set to be 5 V). To the source region (A12), 0 V is applied. The second gate electrode (A20) is set at a prescribed voltage (ex., 2 V). A write pulse with a high voltage (ex., 7 V), which is higher than that of the second gate electrode (A20), is applied to the first gate electrode (A18). At this step, the resistance of the substrate surface (A14) under the second gate electrode (A20) is higher than the resistance of the substrate surface (A15) under the first gate electrode (A18). Accordingly, most of the voltage between the source and the drain is applied to the underlying portion (A14) of the second gate electrode (A20). Further, also in the underlying portion (A14) of the second gate electrode (A20), the side closer to the drain (A13) has a higher electric potential, so that the effective gate voltage is low, resulting in a high resistance. For this reason, hot electrons are generated in a larger amount at the end of the underlying portion (A14) of the second gate electrode (A20) closer to the drain (A13). The generated hot electrons are accelerated in the direction of the charge storage regions (A17) under the electric field due to the first gate electrode (A18), causing injection. The hot electrons are injected intensively into a site (A21) underneath the first gate electrode (A18) and closer to the second gate electrode (A20). The current flowing between the source and the drain at this step is smaller as compared with the configuration having no auxiliary gate because of the higher resistance of the underlying portion (A14) of the second gate electrode (A20). This favorably enables high efficiency injection, so that a small amount of current suffices. Therefore, it becomes possible to simplify the configurations of the peripheral circuits, particularly the power generation circuit.

Writing of the data "0" is performed in the following manner. Namely, a positive voltage is applied to the first gate electrode (A18) to generate a high electric field, so that the electrons stored in the charge storage regions (A17) are attracted to the first gate electrode (A18). For example, the first gate electrode (A18) is set at 12 V, and the source (A12), the drain (A13), and the second gate electrode (A20) are set to 0 V.

Alternatively, writing of the data "0" can also be accomplished in the following manner. Namely, a positive voltage is applied to the second gate electrode (A20) to generate a high electric field, so that the electrons stored in the charge storage regions (A17) are attracted to the second gate electrode (A20). For example, the second gate electrode (A20) is set at 12 V, and the source (A12), the drain (A13), and the first gate electrode (A18) are set to 0 V. Incidentally, in this example, writing of the data "0" is substantially identical to erasing of the data.

Then, the read operation will be described. For example, the drain voltage is set to be 2 V, the source voltage is set to be 0 V, and the voltage of the second gate electrode (A20) is set to be 3.5 V, and a read pulse of 2 V is applied to the first gate electrode (A18). The threshold voltage differs according to whether the amount of charges injected into the charge storage regions (A17) is large or small. Accordingly, the drain current for storing "0" is larger than the drain current for storing "1". As a result, it is possible to perform reading. Alternatively, reading can also be accomplished by interchanging the voltage relationship between the source region and the drain region, like the following relationship:

0 V for the drain region, 2 V for the source region, 2 V for the first gate electrode, and 3.5 V for the second gate electrode.

The examples of voltages for writing of the data "1", writing of the data "0", and reading thereof described above are summarized in Table 2. For these operations, all the electric potentials to be applied to the respective terminals are 0 V, or they are of the same polarity.

TABLE 2

| | Source voltage | Drain voltage | First gate voltage | Second gate voltage | Remarks |
| --- | --- | --- | --- | --- | --- |
| Writing of "1" | 0 V | 5 V | 7 V | 2 V | — |
| Writing of "0" (data erasure) | 0 V | 0 V | 12 V | 0 V | Attraction to A18 |
| | 0 V | 0 V | 0 V | 12 V | Attraction to A20 |
| Reading | 0 V | 2 V | 2 V | 3.5 V | — |

With a conventional flash memory, writing of the data "0" is accomplished in the following manner. Namely, a negative voltage is applied to the gate electrode, so that electrons are allowed to tunnel through the insulation film and to be attracted to the substrate. The electric potential applied to the gate is required to be large because electrons are attracted to the substrate. Further, the electric potential is opposite in polarity to the electric potential used for writing of the data "1", and hence the power generation circuit becomes complicated, incurring not only an increase in chip size, but also an increase in cost.

In this example, writing and reading of either of the data "1" and the data "0" can be both accomplished only by applying electric potentials with the same polarity and almost the same magnitude. Therefore, the power generation circuit becomes simple. As a result, it becomes possible to largely reduce the area of the peripheral circuits.

EXAMPLE 3

Figure 5:
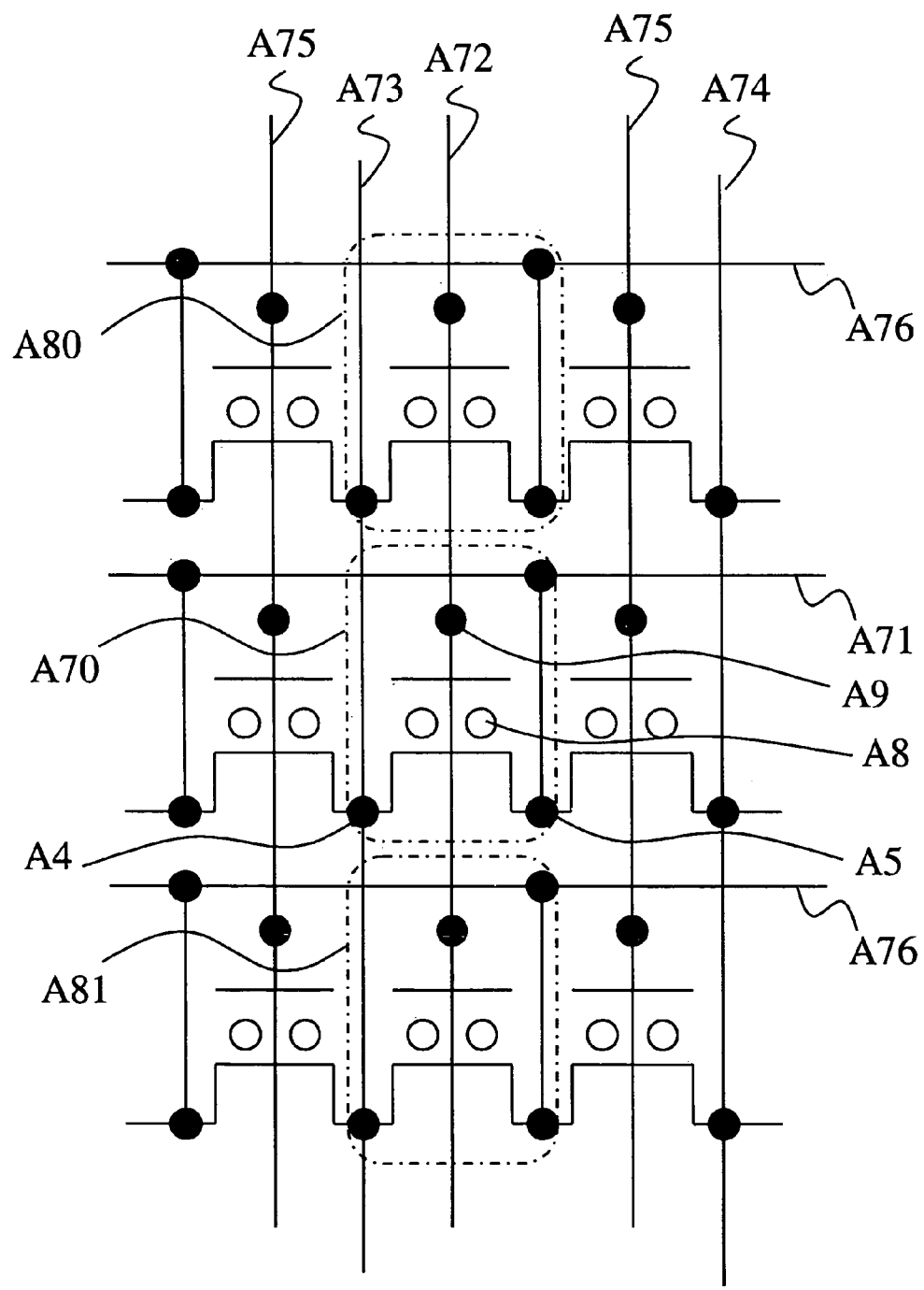
FIG. 5 is an equivalent circuit diagram of a semiconductor memory device of Example 3.

A description will be given to a memory device in accordance with a third example of the present invention. The basic configuration of the elements is the same as with Example 1, and the operation of each element is also the same. However, the memory device has features in operation method according to the connection relationship between the elements. FIG. 5 shows an equivalent circuit diagram of the memory device in accordance with this example. For convenience in description, only the memory cells arranged at the center are respectively given reference characters and numerals A70, A80, and A81, and indicated by dashed lines respectively surrounding them. Further, for the memory cell A70, the reference characters and numerals shown in FIG. 2 are given to their respective corresponding structural elements: source A4, drain A5, gate A9, and charge storage regions A8. A71 and A76 are data lines, and connected to the gate A9. A73 and A74 are source lines, and connected to the source A4. A72 and A75 are word lines, and connected to the gate A9. Actually, a more larger scale memory cell array is configured, but herein, a small scale memory cell array of 3×3 is shown for explanation.

Then, a driving method of this example will be described. In this example, the state in which the amount of stored charges is large is set to correspond to the data "1", while the state in which the amount of stored charges is smaller than with the data "1" is set to correspond to the data "0". First, the write operation of the data will be described. The write operation to the cell (70) is performed in the following manner. Namely, the source line (A73) is set at 0 V. The voltage of the data line (A71) is set, for example, at 0 V for the data "0", or at 5 V for the data "1", according to the data to be written. Whereas, a voltage pulse (ex., 12 V) is applied to the word line (A72). When the data line voltage is set to be 0 V, few hot electrons are generated. Accordingly, the amount of charges injected into the charge storage regions is small. In contrast, when the data line voltage is set to be 5 V, the amount of injected charges is large. As for other cells to be driven by the same word line (A72) at this step, it is also possible to write data thereto simultaneously by setting the voltage of the data line (A76) connected thereto, for example, at 0 V for the data "0", or at 5 V for the data "1", according to the data to be written. Herein, writing of "0" causes no injection of charges, and hence it is equal to not performing writing. Therefore, it is also possible to perform writing of data to only a part of the cells to be driven by the same word line. Further, for other word lines, if the voltages thereof are set at lower voltages (ex., 0 V) than the voltage of the word line connected to the selected memory cell, writing will not be performed.

The erasing operation of data is performed by a single step for the cells (A80), (A70), and (A81) to be driven by the-same word line (A72). Specifically, a positive voltage pulse (ex., 16 V) is applied to the word line (A72) to extract the charges stored in the charge storage regions to the word line, thereby erasing the data. At this step, the source lines (A73) and (A74), and the data lines (A71) and (A76) are set at 0 V. Alternatively, even if 0 V is applied to either of the source line and the data line, and the other is allowed to be open, no problem is presented in the operation. The reason why data erasure can be achieved through application of a positive voltage to the word line, which is avoided from being carried out in a conventional flash memory from the viewpoint of the reliability, is the same as in Example 1.

Further, for the memory cell in which "1" is written, by applying a positive voltage (ex., 16 V) to the word line (A72), and thereby performing erasure, it is possible to attract the excess written charges to the word line (A72) as described above. After erasure, if a positive voltage is further continued to be applied to the word line, this time, electrons start to be injected from the substrate side to the charge storage node. The speed at which charges are injected from the substrate side to the charge storage regions and the speed at which charges are extracted from the charge storage regions to the word line reach equilibrium. Accordingly, the amount of charges stored in the charge storage regions ceases changing with time. Also in the memory cell in which "0" is written, similarly, the injection of charges from the substrate and the emission of charges to the word line reach equilibrium. Accordingly, the number of charges stored in the charge storage regions becomes constant with time. Namely, if over-erasure is performed on either the memory cell in which "1" is written, or the memory cell in which "0" is written, the number of charges stored in the memory cell converges to a constant number. This means the characteristics of respective memory cells self-converge if over-erasure is performed. Therefore, there will not occur the failure that too many charges are extracted to render the memory cell in the normally-ON state, which may happen for a conventional flash memory. With a conventional flash memory, the reliability cannot be ensured, and hence it is not possible to make the erasure characteristics uniform in a self-converging manner by flowing charges from the substrate to the word line via a SiO₂ layer formed by CVD as shown in this example. It becomes possible to perform the operation of flowing charges from the substrate to the word line only after charges are stored in a plurality of dispersed charge storage regions to ensure the reliability.

Then, data reading will be described by taking the memory cell (A70) as an example. For reading data, the source line (A73) is set at 0 V, and the data line (A71) is precharged at a higher voltage (ex., 3 V) than the source line (A73) voltage. Thereafter, a read pulse with a positive voltage (ex., 2 V) is applied to the word line (A72). At this step, when the data "1" is written in the memory cell (A70), and the threshold voltage is high, a large current does not flow, so that the data line (A71) potential does not change largely from the precharge voltage. In contrast, when the data "0" is written, and the threshold voltage is low, a large current flows, so that the data line (A71) potential drops largely from the precharge voltage. One end of the data line is connected to a sense amplifier, whereby the voltage variations are amplified to read the data.

EXAMPLE 4

Figure 6:
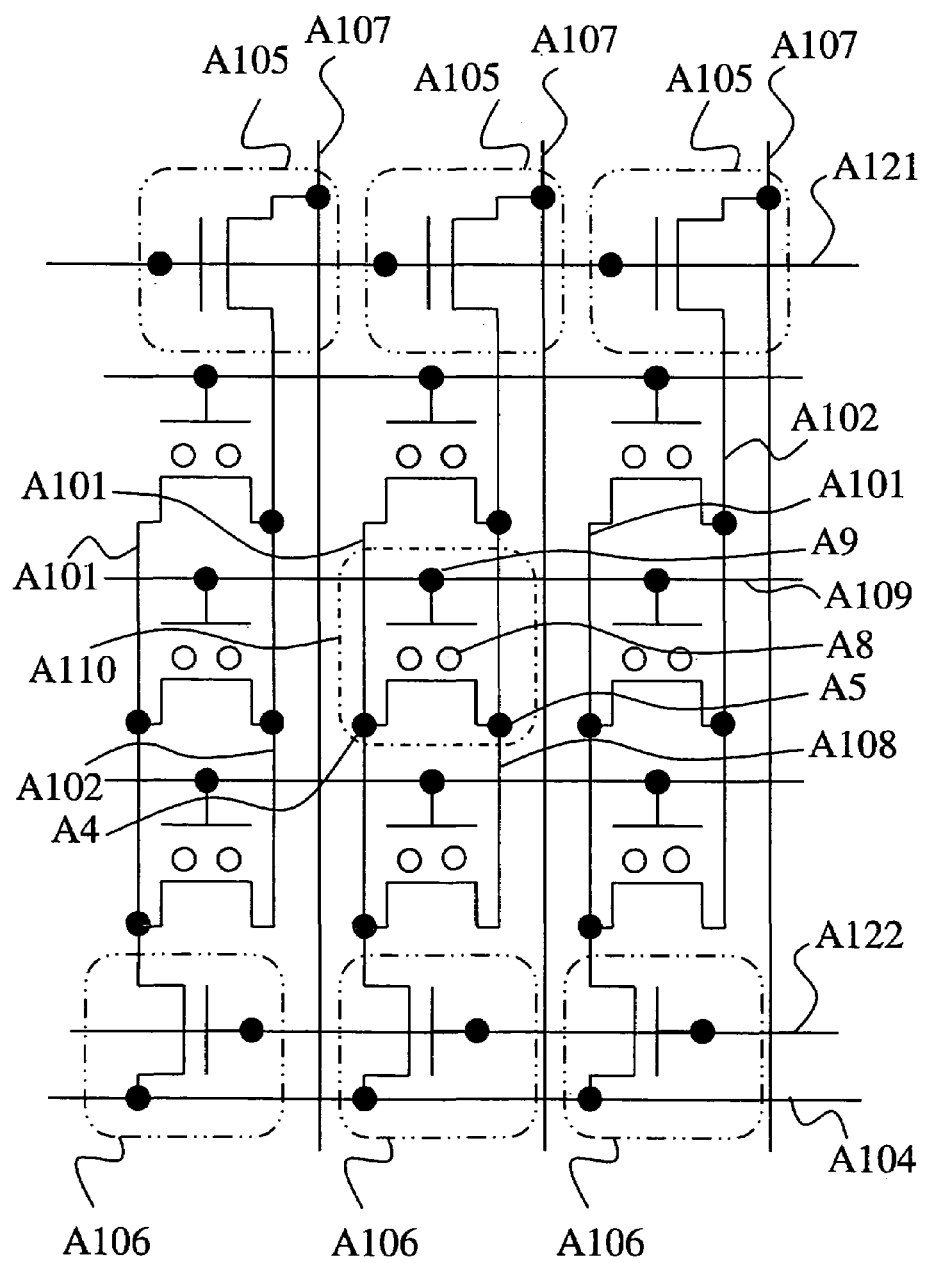
FIG. 6 is an equivalent circuit diagram of a semiconductor memory device of Example 4.

A memory device in accordance with a fourth example of the present invention will be described. The basic configuration of the elements is the same as with Example 1, and the operation of each element is also the same. However, the memory device has features in the connection relationship between the elements. FIG. 6 shows an equivalent circuit diagram of the memory device in accordance with this example. For convenience in description, only the memory cell arranged at the center is given a reference character and numeral A110, and indicated by a dashed line surrounding it. Further, for the memory cell A110, the reference characters and numerals shown in FIG. 2 are given to their respective corresponding structural elements: source A4, drain A5, gate A9, and charge storage regions A8. Actually, a more larger scale memory cell array is configured, but herein, a small scale memory cell array of 3×3 is shown for explanation.

In this example, the source regions and the drain regions of a plurality of memory cells are both connected by a diffusion layer to form a local source line (A101) and local data lines (A102) and (A108). The local source line (A101) is connected to a source line (A104) via a select transistor (A106). The local data lines (A102) and (A108) are connected to a data line (A107) via a select transistor (A105). As compared with Example 3, the select transistors (A105) and (A106) become required. However, they may be provided in common to a plurality of cells to be driven by the same local source line (A101) and the same local data lines (A102) and (A108). Therefore, the increase in cell area may be substantially negligible. On the contrary, respective memory cells are connected by the diffusion layer, so that it is possible to reduce the number of data line contacts. Accordingly, it is possible to reduce the memory cell area. In consequence, when the memory capacity is large, a large effect is produced for cost reduction.

Then, the driving method of this example will be described. First, the write operation will be described. The write operation to the cell (A110) is performed in the following manner. Namely, a driving voltage is applied to gate lines (A121) and (A122) of the select transistors (A105) and (A106) to turn on the select transistors (A105) and (A106), and the source line (A104) is set at 0 V. The voltage of the data line (A107) is set, for example, at 0 V for the data "0", or at 5 V for the data "1", according to the data to be written. Whereas, a high voltage pulse (ex., 12 V) is applied to a word line (A109). When the data line (A107) voltage is set to be 0 V, few hot electrons are generated. Accordingly, the amount of charges injected into the charge storage regions is small. In contrast, when the data line (A107) voltage is set to be 5 V, the amount of injected charges is large. As for other cells to be driven by the same word line (A109) at this step, it is also possible to write data thereto simultaneously by setting the voltage of the data line (A107) connected thereto according to the data to be written. Herein, writing of "0" causes no injection of charges, and hence it is equal to not performing writing. Therefore, it is also possible to perform writing of data to only a part of the cells to be driven by the same word line. Further, for other word lines, if the voltages thereof are set at lower voltages (ex., 0 V) than the voltage of the word line connected to the selected memory cell, writing will not be performed. Alternatively, writing of the data "1" to the memory cell (A110) may also be accomplished in the following manner. The data line (A107) is set at 0 V, and a positive voltage (ex., 5 V) is applied to the source line (A104). Subsequently, a positive voltage pulse (ex., 12 V) is applied to the word line (A109).

Also in the case of this example, charges are stored in a plurality of dispersed charge storage regions to hold a high charge retention characteristic. This implements the self-converging property of the erasure characteristics due to extraction of the stored charges to the word line, and flowing of the charges from the substrate to the word line via the charge storage regions.

Then, the data reading operation will be described by taking the data reading from the memory cell (A110) as an example. The source line (A104) is set at 0 V, and a driving voltage is applied to a gate line (A122) of the select transistor (A106) to turn on the select transistor (A106). On the other hand, a driving voltage is applied to a gate line (A121) of the select transistor (A105) to turn on the select transistor (A105). Thus, the data line (A107) and the local data line (A108) are precharged to a positive voltage (ex., 3 V). Thereafter, a read pulse with a positive voltage (ex., 2 V) is applied to the word line (A109). At this step, when the data "1" is written and charges are stored in the memory cell (A110) from which the data is to be read, and the threshold voltage is high, a large current does not flow through the memory cell (A110). Accordingly, the data line (A107) potential does not change largely from the precharge voltage. In contrast, when the data "0" is written and no charge is stored in the memory cell (A110), the threshold voltage is low. Accordingly, a large current flows through the memory cell (A110), so that the data line (A107) potential drops largely from the precharge voltage. One end of the data line (A107) is connected to a sense amplifier, whereby the voltage variations are amplified to read the data.

EXAMPLE 5

A memory device in accordance with a fifth example of the present invention will be described. The basic configuration of the elements is the same as with Example 2, and the operation of each element is also the same. However, the memory device has features in the configuration of the cross section and the manufacturing method according to the connection relationship between the elements.

Figure 7:
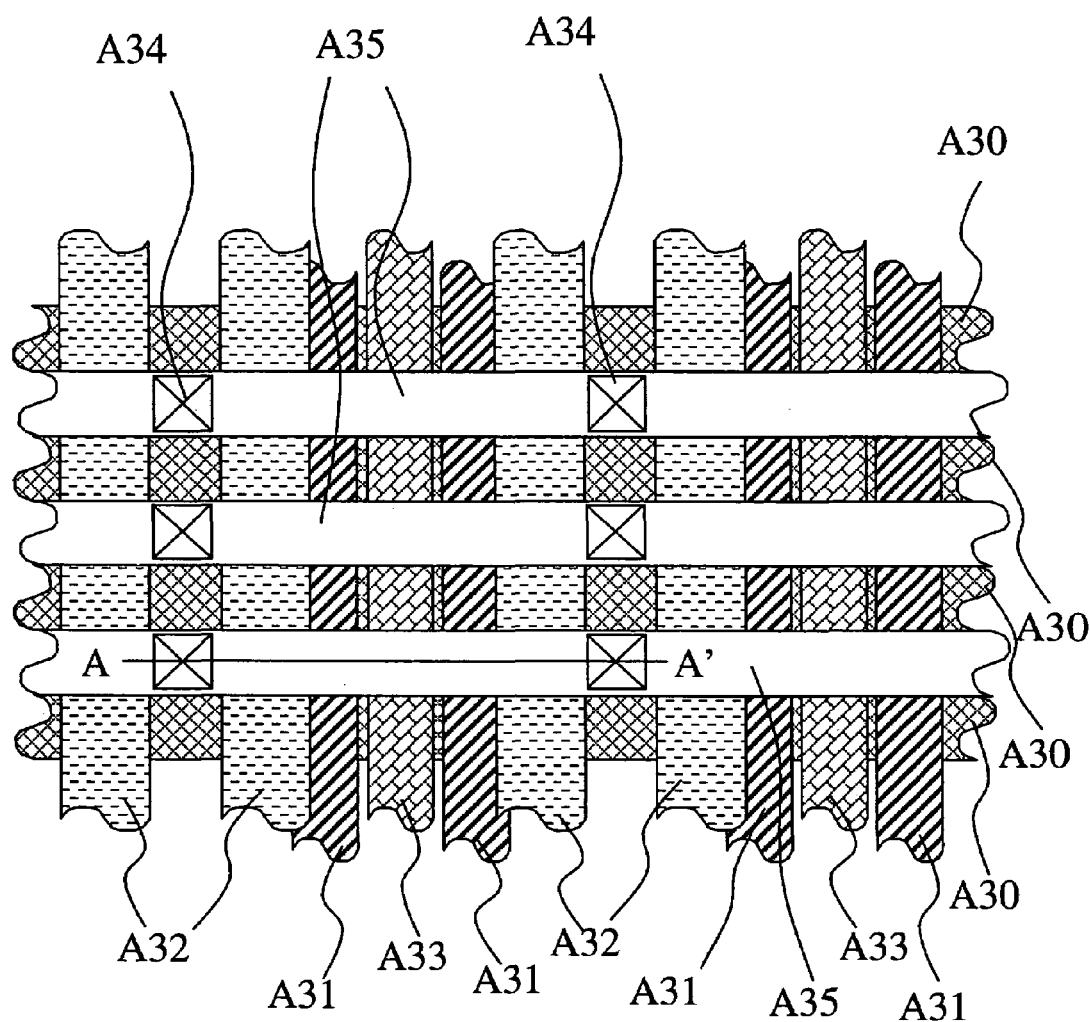
FIG. 7 is a layout diagram of the semiconductor memory device of Example 4.

FIG. 7 shows the layout diagram of the memory device in accordance with this example. Actually, a more larger scale memory cell array is configured, but herein, a small scale memory cell array of 3×3 is shown for explanation. There is an isolation region (A30) provided on a P-type silicon substrate. Perpendicularly with respect to the isolation region (A30), a second word line (A31) made of polysilicon, corresponding to the second gate (A20) described in FIG. 3, is disposed. In parallel to the second word line, a first word line (A32) made of polysilicon, corresponding to the first gate (A18) described in FIG. 3, and a source line (A33) made of tungsten are disposed. As shown in this figure, the memory device is so configured that a group of the sequence of the first word line (A32), the second word line (A31), the source line (A33), the second word line (A31), and the first word line (A32) repeatedly occurs. The respective first word lines (A32) at the ends of the neighboring groups of the sequence are adjacent to each other. Data line contacts (A34) are disposed in the region between the adjacent first word lines except for the isolation region. A data line (A35) made of tungsten is disposed so as to pass over the data line contacts (A34), and to be in parallel to the isolation region (A30).

Figure 8:
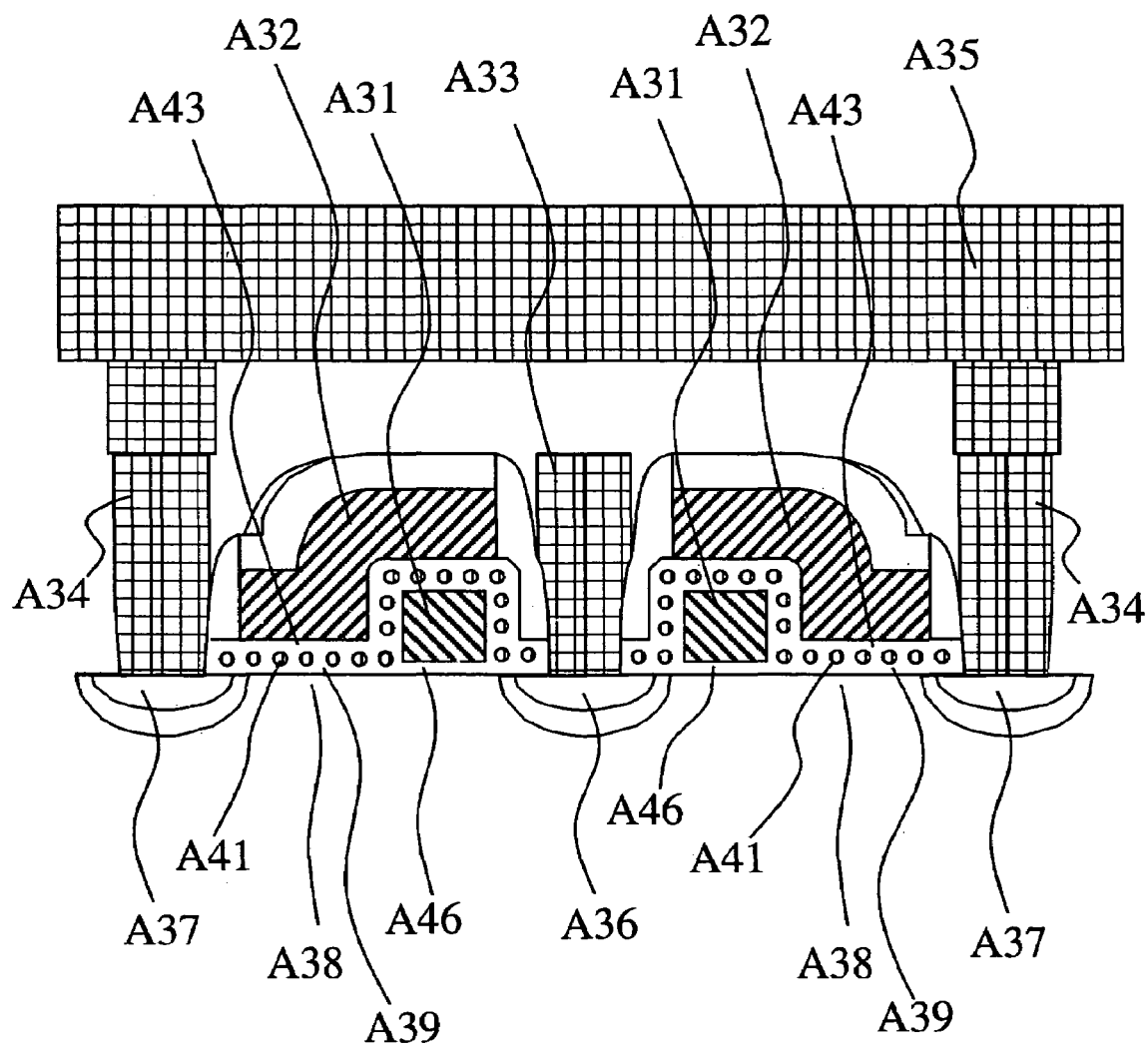
FIG. 8 is a diagram showing the configuration of the cross section of a semiconductor memory device of Example 5.

FIG. 8 shows a cross sectional view taken on line A–A' of FIG. 7. On a P-type silicon substrate, N-type source region (A36) and drain region (A37) are provided. On a channel (A38) connecting the source region (A36) and the drain region (A37), a 7 nm-thick insulation film (A39) is disposed. On the insulation film (A39), the second word line (A31) made of polysilicon is disposed. Further, on the insulation film (A39), a plurality of silicon microcrystal grains (A41) with a mean diameter of 10 nm serving as charge storage regions are arranged. On the second word line (A31), the first word line (A32) made of N-type polysilicon for controlling the electric potentials of the charge storage regions and the underlying channel is disposed. Between the first word line (A32) and the silicon microcrystal grains (A41) serving as the charge storage regions, there is disposed an insulation film (A43) of a so-called ONO structure in which a 3 nm-thick $SiO_2$ film, a 6 nm-thick $Si_3N_4$ film, and a 4 nm-thick $SiO_2$ film are stacked in this order from the lowest. Further, on the source region (A36), the source line (A33) formed of tungsten is formed. On the drain region (A37), a plug (data line contact (A34)) made of tungsten is formed, and connected to the data line (A35).

A manufacturing process of this example will be described. After forming the isolation region (A30) and the triple-well structure, B (boron) ion implantation for controlling the threshold voltage is performed on the P well. The substrate surface is oxidized to form a gate oxide film (A46). Subsequently, a polysilicon film and a $SiO_2$ film are deposited thereon for forming the second word line (A31). By using a resist as a mask, the $SiO_2$ film and the polysilicon film are successively etched. In this step, the second word line (A31) is formed. By using the second word line (A31) as a mask, impurities are implanted thereto to adjust the impurity concentration under the first word line (A32). After cleaning, the substrate surface is oxidized to form a 6 nm-thick tunnel oxide film (A39). Subsequently, the silicon microcrystal grains (A41) are formed by CVD (Chemical Vapor Deposition). In a prototype, the grains were formed with a mean grain size of 8 nm and a density of $3 \times 10^{11}$ cm$^2$. Then, an ONO insulation film made up of a 3 nm-thick $SiO_2$ film, a 5 nm-thick $Si_3N_4$ film, and a 3 nm-thick $SiO_2$ film in this order from the lowest is deposited thereon. Thereafter, a polysilicon film for forming the first word line (A32) and a $SiO_2$ film are deposited thereon. By using a resist mask, the $SiO_2$ film and the polysilicon film are successively etched. Then, the $Si_3N_4$ film and the $SiO_2$ film are deposited, and planarization is performed. After planarization, a $SiO_2$ film is deposited again. Herein, a pattern of the source line (A33) and the data line, contact (A34) is transferred to a resist. By using this resist as a mask, the $SiO_2$ film is etched. Even if the resist pattern of the data line contact (A34) and the source line (A33) has some misalignment, openings are properly formed in a self-aligned manner so as to respectively expose the drain region and the source region respectively because the underlayer is made of $Si_3N_4$. Further, by etching the underlying $Si_3N_4$, the openings respectively exposing the drain region (A37) and the source region (A36) of the substrate are formed. Herein, for ensuring the reliability of the contact, P (phosphorous) ions are implanted thereinto, followed by a heat treatment for activation. Thereafter, a $SiO_2$ film is deposited, and etched back to prevent a short between the data line contacts. Then, tungsten is deposited, and planarization is performed. After planarization, a $SiO_2$ film, a tungsten film, and a $SiO_2$ film are deposited. The pattern of the data line (A35) is transferred to a resist, so that the $SiO_2$ film, the tungsten film, and the $SiO_2$ film are etched to form the data line (A35). Subsequently, a $SiO_2$ film is deposited as an interlayer film. Hereafter, the same step is repeated to perform a wiring step. In this step, the silicon microcrystal grains (A41) are left on the top and the sides of the second word-line (A31). However, they will not hinder the function of the memory cell, and hence there is no necessity to remove them.

With a conventional flash memory, the surface of polysilicon constituting a floating gate is weakly oxidized after completion of the processing of the floating gate. This oxidization process improves the insulating property of the floating gate. Accordingly, it is possible to improve the charge retention characteristic. However, on the other hand, the gate oxide film of a peripheral circuit, or if a high-speed logic circuit is merged therewith, the gate oxide film of the logic circuit is increased in thickness. In consequence, the current of the transistor is reduced in amount, incurring operation delay. However, in this example, the charge storage node is formed of a plurality of silicon microcrystal grains (A41), and hence the charge retention characteristic is high. Therefore, there is no necessity to adopt the process corresponding to the oxidization process of the floating gate, which is suitable for merging with a high-speed logic circuit.

Figure 9:
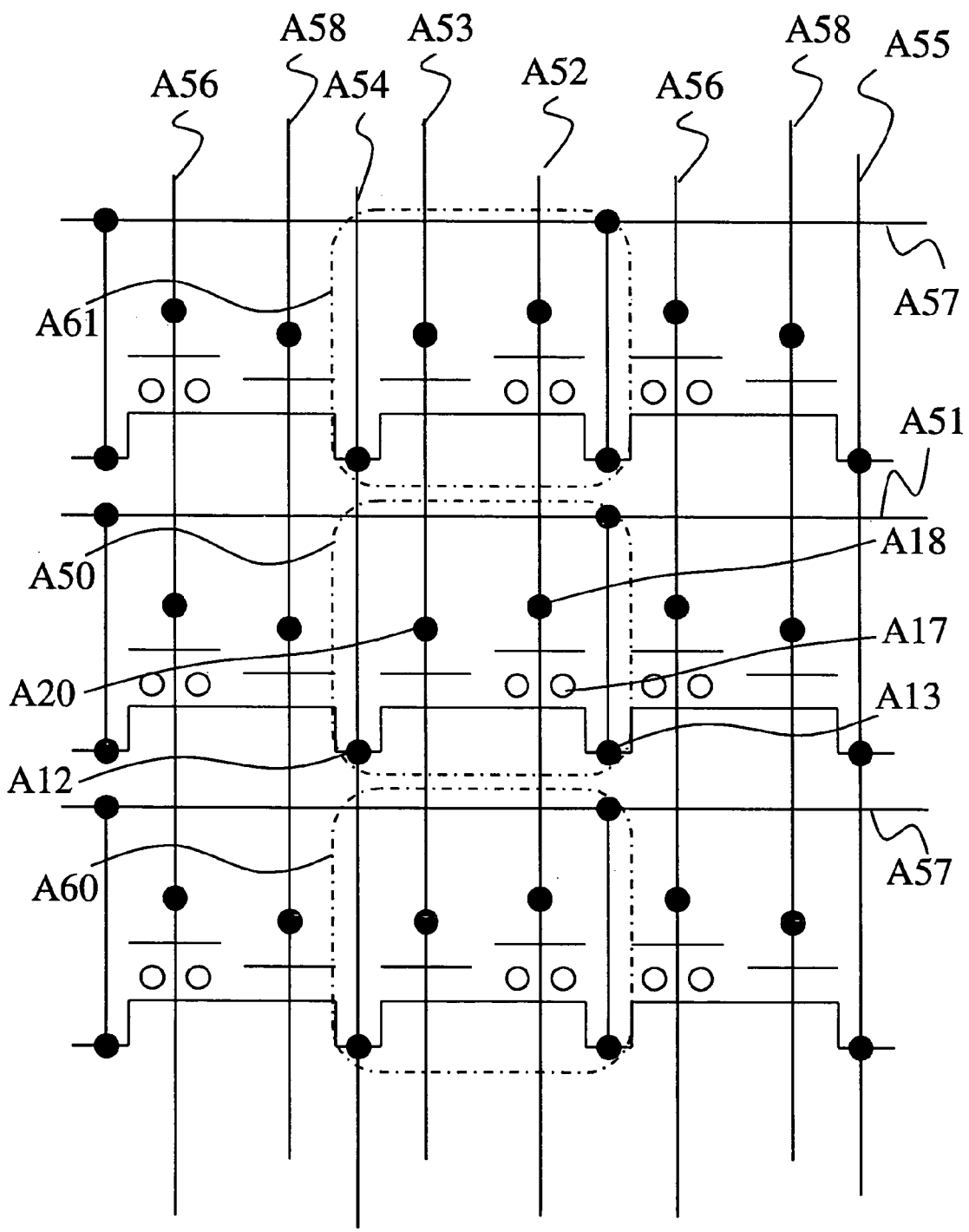
FIG. 9 is an equivalent circuit diagram of the semiconductor memory device of Example 5.

FIG. 9 is a circuit diagram showing the connection relationship between the memory cells of the memory device in accordance with this example. Actually, a more larger scale memory cell array is configured, but herein, a small scale memory cell array of 3×3 is shown for explanation. Further, for convenience in description, three memory cells A50, A60, and A61 at the central column are indicated by their corresponding dashed lines respectively surrounding them. Further, respective structural elements of the memory cell A50 are given their respective corresponding reference characters and numerals shown in FIG. 4.

The operation of this example will be described by reference to FIG. 9. First, the write operation will be described.

Writing of data will be described by taking the memory cell (A50) as an example. Herein, this memory cell (A50) is referred to as the selected cell, and other memory cells are referred to as non-selected cells. Writing of data to the selected cell (A50) is performed in the following manner. Namely, a positive voltage pulse (ex., 6 V) is applied to a data line (A51), a positive voltage pulse (ex., 8 V) to a first word line (A52), and a positive voltage pulse (ex., 2 V) to a second word line (A53). At this step, a source line (A54) is set at 0 V. By using such a voltage relationship, it becomes possible to generate hot electrons on the source side, as distinct from conventional writing utilizing hot electrons generated at the drain side. Whereas, 0 V is applied to a source line (A55) connected to non-selected cells, a first word line (A56) connected to non-selected cells, and a data line (A57) connected to non-selected cells. To a second word line (A58) connected to non-selected cells, a smaller positive voltage (ex., 0.5 V) than that of the second word line (A53) connected to the selected cell is applied. In consequence, it is possible to inhibit writing of data to non-selected cells.

Data erasure is performed by a single step for the memory cells connected to one first word line. Below, a description will be given by taking the memory cells (A50), (A60), and (A61) connected to the first word line (A52) as examples. Herein, the memory cells connected to the first word line (A52) are referred to as the selected cells, and other memory cells are referred to as non-selected cells. A positive voltage pulse (ex., 12 V) is applied to the first word line (A52), and a positive voltage pulse (ex., 5 V) to the second word line (A53). At this step, the source line (A54) is set at 0 V. In consequence, the charges stored in the charge storage node are extracted to the first word line (A52). It is also possible that the charges stored in the charge storage node are extracted to the second word line by reversing the voltage relationship between the second word line and the first word line. Alternatively, it is also, of course, possible that the charges stored in the charge storage node are extracted to both the first word line and the second word line by adjusting the voltage relationship. Whereas, 0 V is applied to the source line (A55) connected to the non-selected cells, the first word line (A56) connected to the non-selected cells, the data line (A57) connected to the non-selected cells, and the second word line (A58) connected to the non-selected memory cells.

Herein, the stored charges have been extracted to the first word line and the second word line. However, it is needless to say that data erasure may also be performed in the following manner. Namely, in the same manner as with a conventional flash memory, 0 V or a negative voltage is applied to the first word line and the second word line, thereby extracting the charges to the substrate.

Reading of data will be described by taking the memory cell (A50) as an example. Herein, this memory cell (A50) is referred to as a selected cell, and other memory cells are referred to as non-selected cell. Reading of data from the selected memory cell (A50) is performed in the following manner. Namely, the data line (A51) connected to the selected memory cell (A50) is precharged to a positive voltage (ex., 2 V). At this step, the source line (A54) connected to the selected memory cell (A50) is set at 0 V. A positive voltage pulse (ex., 2 V) is applied to the first word line (A52) connected to the selected memory cell (A50), and a positive voltage pulse (ex., 2 V) is applied to the second word line (A53) connected to the selected memory cell (A50). Thus, the change in voltage of the data line (A51) connected to the selected memory cell (A50) is amplified by a sense amplifier. The threshold voltage of the selected memory cell (A50) differs according to whether the amount of charges injected into the charge storage regions of the selected memory cell (A50) is large or small. Therefore, when the data "0" is written, the threshold voltage of the memory cell is low. Accordingly, a current flows through the selected memory cell, and hence the data line (A51) voltage decreases with time. When the data "1" is written, the threshold voltage of the memory cell is high. Accordingly, a current flows in a smaller amount through the selected memory cell, and hence the data line (A51) voltage shows almost no changes even when time has passed. It is possible to perform reading by utilizing the difference.

In this example, 0 V or voltages of identical polarity are used for all of writing, erasing, and reading of data. Further, since data is written with high efficiency by using source side injection by means of the second gate, the load on the power circuit is smaller as compared with conventional hot electron injection writing. Therefore, the peripheral circuits, particularly, the power circuit becomes simple. This produces a significant effect on the reduction in element area when the memory capacity is relatively small, and the area of the peripheral circuits is not negligible as compared with the memory cell area, as in the case where the circuit is to be incorporated into another system, enabling a large cost reduction.

EXAMPLE 6

Figure 10:
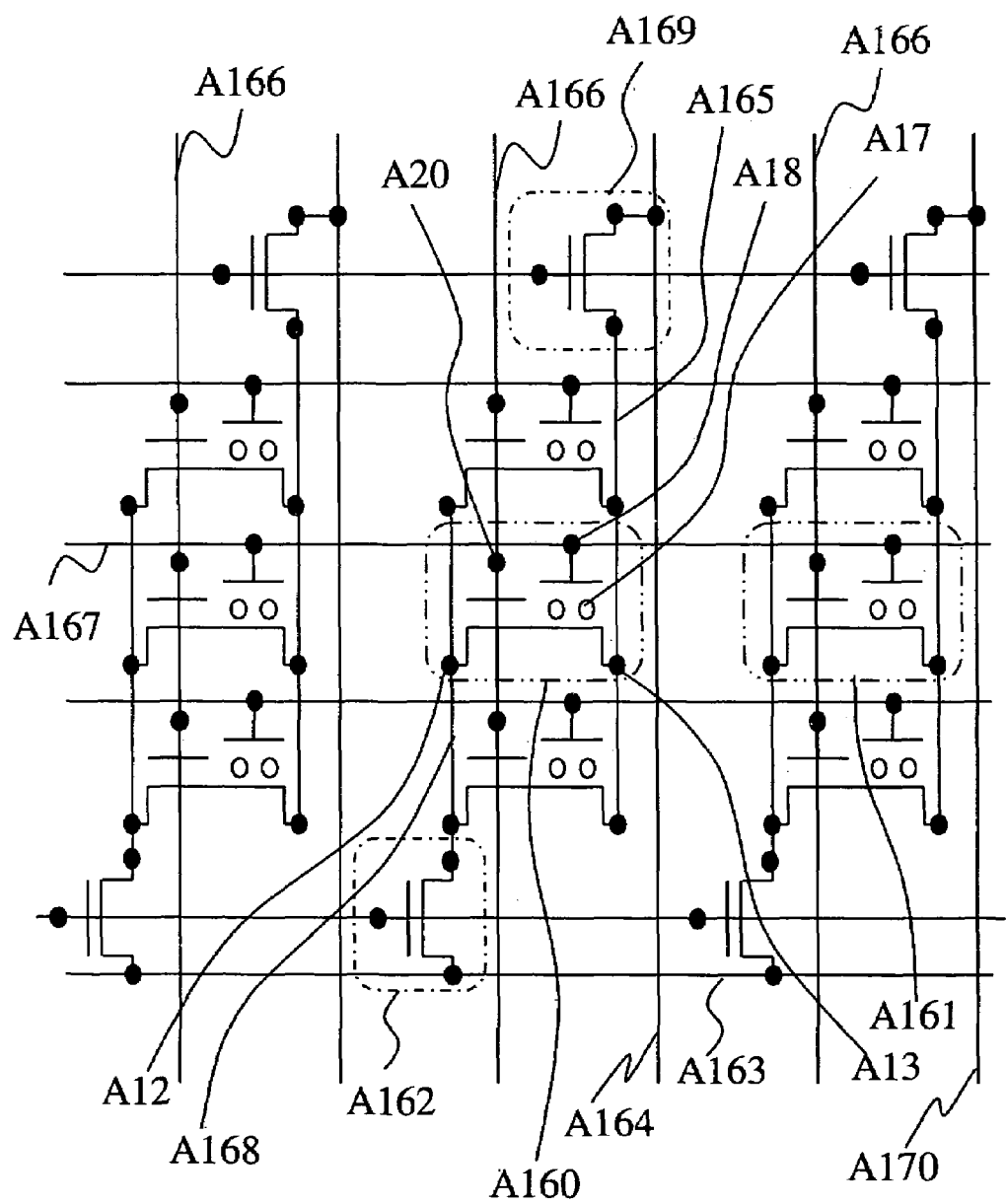
FIG. 10 shows an equivalent circuit of a semiconductor memory device of Example 6.
Figure 11:
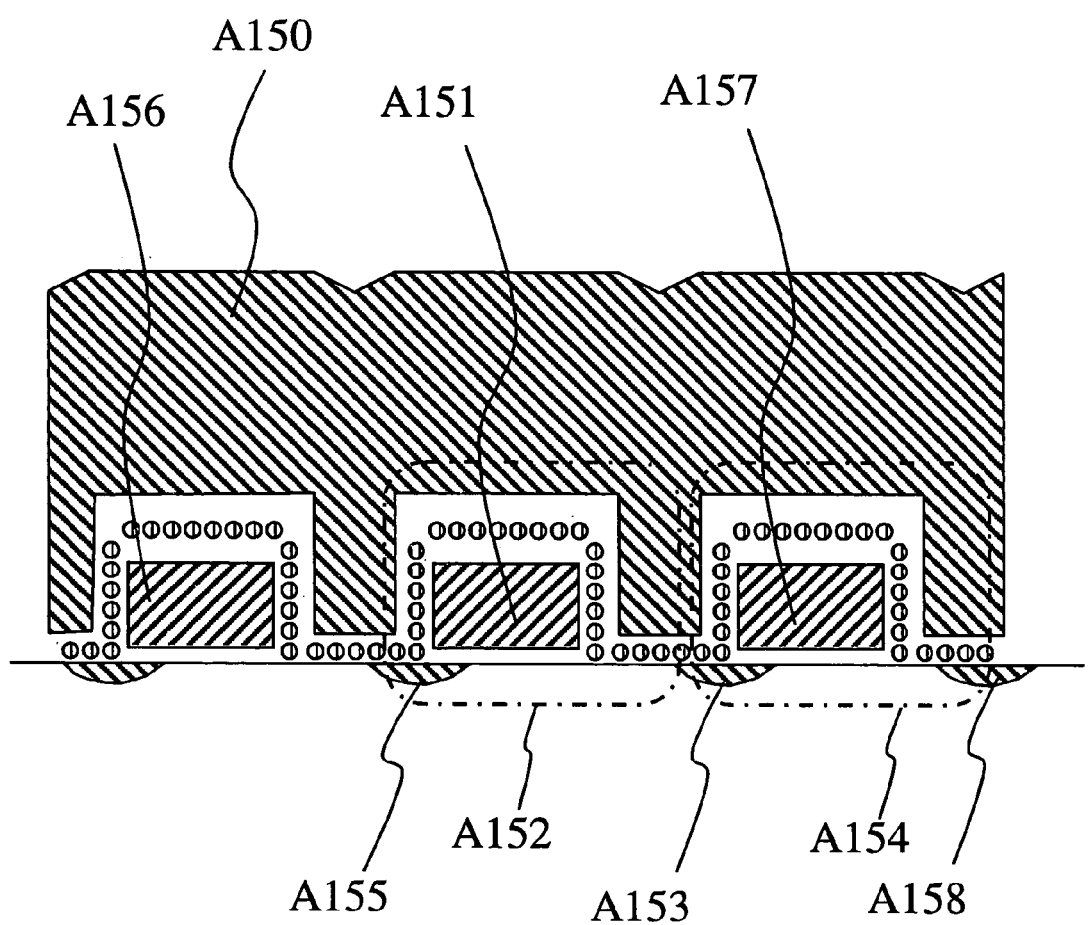
FIG. 11 is a cross sectional diagram of the semiconductor memory device of Example 6.

FIG. 10 shows an equivalent circuit diagram of a memory device in accordance with a sixth example of the present invention. The basic configuration of the elements is the same as with Example 2, and the operation of each element is also the same. However, the memory device has a difference in cross sectional configuration, and has features in operation method according to the connection relationship between the elements. FIG. 11 shows the cross sectional configuration of the memory device in accordance with this example.

The equivalent circuit diagram shown in FIG. 10 corresponds to FIG. 6 showing the equivalent circuit diagram of the memory device based on the elements of Example 1. For convenience in description, only the memory cells arranged at the central row are given reference characters and numerals A160 and A161, and indicated by their corresponding dashed lines respectively surrounding them. As for the memory cell A160, respective structural elements are given their respective corresponding reference characters and numerals shown in FIG. 4: source A12, drain A13, first gate A18, second gate A20, and microcrystal grains A17. Actually, a more larger scale memory cell array is configured, but herein, a small scale memory cell array of 3×3 is shown for explanation.

In this example, the source regions and the drain regions of a plurality of memory cells are both respectively connected by a diffusion layer to form a local source line (A168) and a local data line (A165). The local source line (A168) is connected to a source line (A163) via a select transistor (A162). The local data line (A165) is connected to a data line (A164) via a select transistor (A169) As with Example 4, the select transistors (A162) and (A169) become necessary. However, they may be provided in common to a plurality of cells to be driven by the same local source line (A168) and the same local data line(A165). Therefore, the increase in cell area may be substantially negligible. On the contrary, respective memory cells are connected by the diffusion layer, so that it is possible to reduce the number of data line contacts. Accordingly, it is possible to reduce the memory cell area. In consequence, when the memory capacity is large, a large effect is produced for cost reduction.

The write operation will be described by taking writing of data to the memory cell (A160) in FIG. 10 as an example. First, the select transistors (A169) and (A162) are turned on, and the source line (A163) is set at 0 V. The voltages of the data line (A164) and the local data line (A165) are set, for example, at 0 V for the data "0", or at 5 V for the data "1", according to the data to be written. Whereas, a positive voltage pulse (ex., 2 V) is applied to a second word line (A166), and a positive voltage pulse (ex., 8 V) to a first word line (A167). When the data line (A164) voltage is set to be 0 V, few hot electrons are generated. Accordingly, the amount of charges injected into the charge storage regions is small. In contrast, when the data line (A164) voltage is set to be 5 V, hot electrons are generated with high efficiency, so that charges are injected into the charge storage regions. At this step, also for other cells to be driven by the same first word line (A167), for example, A161, it is possible to write data thereto simultaneously by setting the voltage of the data line (A170) connected thereto, according to the data to be written.

Data erasure is performed by a single step for a plurality of memory cells connected to one first word line. A positive voltage (ex., 15 V) is applied to the first word line, and 0 V or a positive voltage (ex., 0.5 V), which is lower than the voltage applied to the first word lime, is applied to the second word line. In consequence, the charges stored in the charge storage regions are extracted. Erasure may also be performed in a single step for a plurality of memory cells connected to the second word line. In this case, a positive voltage (ex., 15 V) is applied to the second word line, and 0 V or a positive voltage (ex., 0.5 V), which is lower than the voltage applied to the second word lime, is applied to the first word line. In consequence, the charges are extracted to the second word line.

In FIG. 11, a first gate electrode (A150) is left unchanged to form the first word line (A167) as with the word line (A35) in FIG. 7. Similarly, second gate electrodes (A151), (A156), and (A157) form the second word line (A166), which is wired in a direction perpendicular to the first gate electrode (A150). Further, the drain region of one memory cell also serves as the source region of the adjacent memory cell. For example, a drain region (A153) of a memory cell (A152) also serves as the source region of the adjacent memory cell (A154). Similarly, the source region (A155) of the memory cell (A152) also serves as the drain region of the adjacent memory cell on the left side thereof. Similarly, in the adjacent memory cell on the left side thereof, a source region-cum-drain region is formed. A drain region (A158) is formed for the memory cell (A154) at the rightmost end. Whereas, a source region is formed for the memory cell at the leftmost end. The source regions-cum-drain regions (A153) and (A155), and the drain region and the source region on opposite ends are respectively connected by diffusion layer wiring, to run in a direction parallel to the second word line (A151). In general, with such a configuration in which source and drain regions are shared among a plurality of cells, and the sources and drains of a plurality of memory cells are connected in parallel to each other, the drain regions of a plurality of memory cells and the source regions of their respective adjacent elements are required to be physically insulated from each other by isolation regions. However, in this example, the memory cell isolation is achieved in the following manner. Namely, the electric potentials of the second word lines (A151), (A156), and (A157) are controlled, so that the adjacent memory cells are electrically isolated from each other. Thus, physical isolation is not performed, and the isolation region is not required. In consequence, it is possible to reduce the area of the memory cell, which produces a significant effect on cost reduction.

Also in a manufacturing process of this example, the same steps as in Example 5 are performed until the step for forming silicon microcrystal grains serving as the charge storage regions. The silicon microcrystal grains are left on the top and the sides of the second word lines (A151), (A156), and (A157). However, also in this example, they will not hinder the function of the memory cell, and hence there is no necessity to remove them.

The operation of this example is characterized in that writing or reading is performed on the cells to be driven by the same word line at every one cell interval. For example, when the write or read operation is performed on the cell (A152), the second word lines (A156) and (A157) of the adjacent cells are set at a low voltage, and the silicon surface under the second word line is set at a high resistance. In consequence, a short between the elements to be driven by the same first word line is prevented.

EXAMPLE 7

Figure 12:
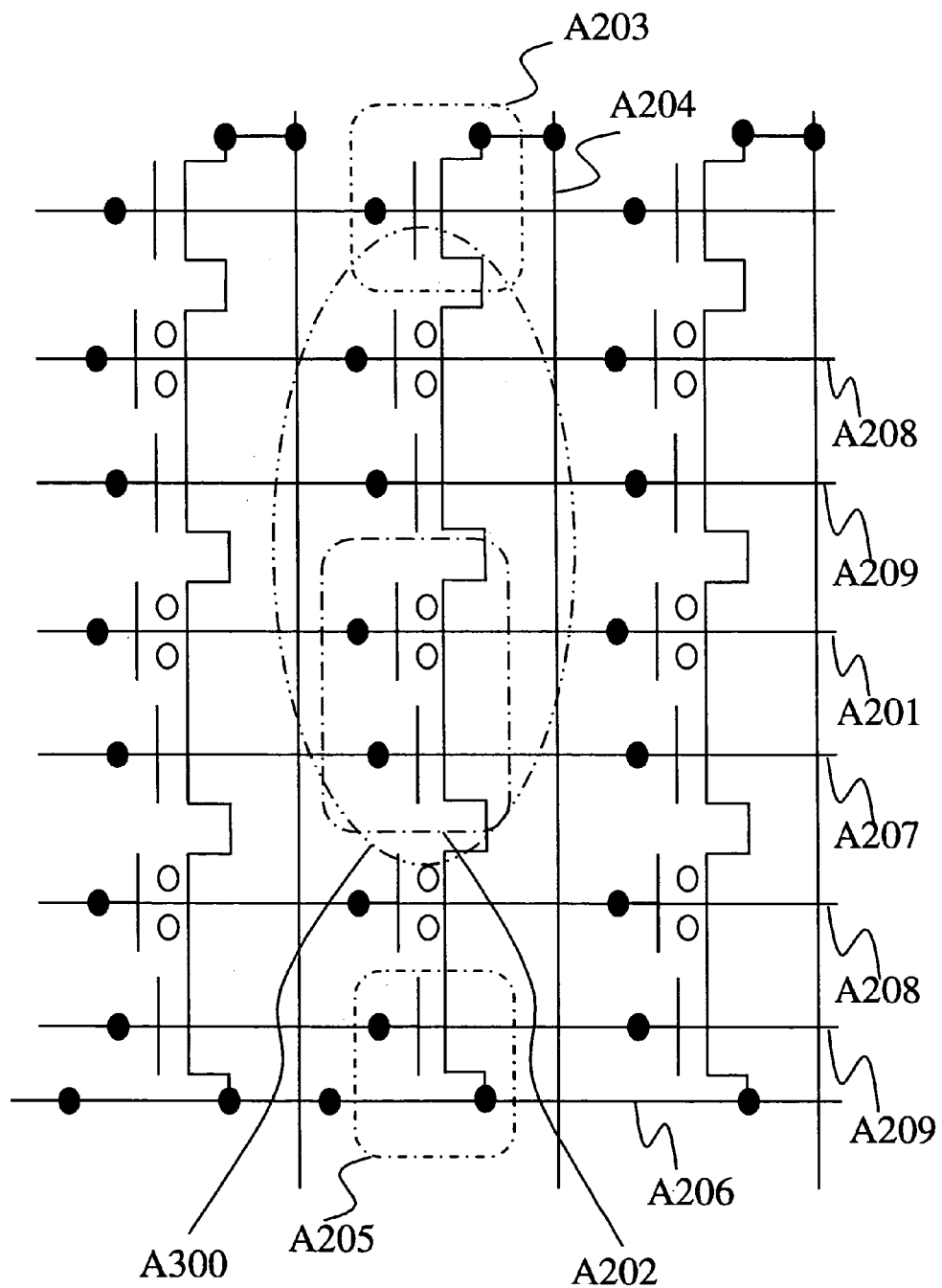
FIG. 12 shows an equivalent circuit of a semiconductor memory device of Example 7.
Figure 13:
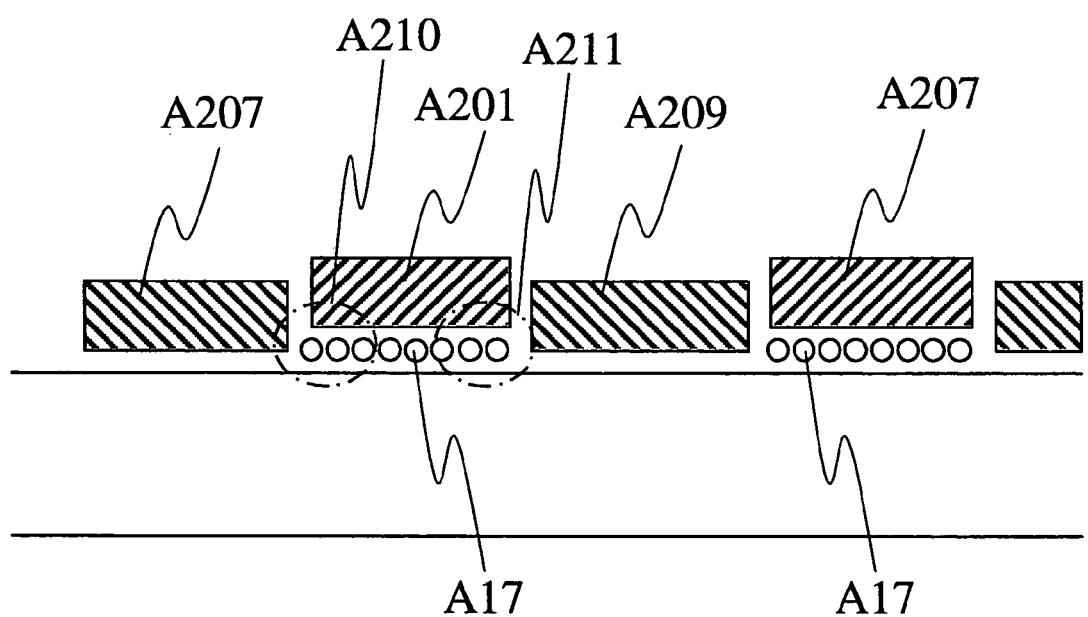
FIG. 13 is an isometric cross sectional diagram of the semiconductor memory device of Example 7.

A seventh example of the present invention will be described. FIG. 12 shows the equivalent circuit diagram of an array structure. Actually, a more larger scale memory cell array is configured, but herein, a small scale memory cell array of 3×3 is shown for explanation. For convenience in description, a memory cell (A202) at the central portion is indicated by a dashed line surrounding it. FIG. 13 is a cross sectional diagram taken along the direction perpendicular to the word line in the oval region indicated by a two-dot chain line of the memory cell portion adjacent in the longitudinal direction of the diagram to the memory cell (202) indicated by a dashed line surrounding it in FIG. 12. In FIG. 13, the elements denoted by a reference character and numeral (A17) are silicon microcrystal grains which are the charge storage regions in FIG. 13. This example is characterized in that memory elements are connected in series as distinct from the foregoing examples. It is characterized in that the configuration of series-connected elements makes the resistance high, but makes the cell area small.

Writing of data in this example will be described. In writing of data to the memory cell (202) to be driven by a first word line (A201), a select transistor (A203) is turned on, and a data line (A204) is set, for example, at 0 V for the data "0", or at 5 V for the data "1", according to the data to be written. At this step, a select transistor (A205) is turned on, and a source line (A206) is set at 0 V. Further, a first word line (A208) and a second word line (A209) other than the first word line (A201) of the memory cell (A202) to be written and the second word line (A207) of the cell are set at a prescribed high potential (ex., 5 V for all). Thus, the channel portions under the second word line and under the first word line are set in a low resistance state. The second word line (A207) of the memory cell to be written is set at a lower potential (ex., 2 V) than that of other second word line (A209), so that the underlying substrate surface is set at a relatively high resistance. The first word line (A201) potential of the memory cell (A202) to be written is set to be higher potential (ex., 12 V) than other first word line potential. As a result, hot electrons are generated on the substrate surface between the second word line (A207) and the first word line (A201) to be injected into the neighboring charge storage regions (A210) when the data line (A204) is set at a high voltage (ex., 5 V). In contrast to the case where the data line (A204) potential is set to be high potential, when the data line (A204) potential is set at a low voltage, few hot electrons are generated, so that few charges are injected. The relationship between the electric potential of the first word line (A201) of the memory cell to be written and the electric potential of the second word line (A209) of the adjacent memory cell is made equal to the relationship between the electric potential of the first word line (A201) and the electric potential of the second word line (A207) of the memory cell (A202) to be written. As a result, hot electrons are generated on the substrate surface between the second word line (A209) and the first word line (A201) to be injected into the neighboring charge storage regions (A211).

Data erasure is performed on a first word line-by-a first word line basis in the same manner as in Examples 3 to 6. A positive voltage (ex., 15 V) is applied to the first word line (A201), so that the charges stored in a plurality of charge storage regions are extracted to the first word line (A201). In this step, the second word line (A207) is set at a lower voltage (ex., 0 V) than that applied to the first word line. Alternatively, erasure may also performed in the following manner. Namely, a positive voltage (ex., 15 V) is applied to the second word line (A207), and a lower voltage (ex., 0 V) than the voltage applied to the second word line (A207) is applied to the first word line (A201). In consequence, the charges are extracted to the second word line (A207). Also in this example, charges are stored in a plurality of dispersed charge storage regions to hold a high charge storage characteristic. This implements the self-converging property of the erasure characteristics due to extraction of the stored charges to the first word line or the second word line, or flowing of the charges from the substrate to the first word line or the second word line via the charge storage regions.

In the read operation, the select transistor (A203) is turned on, and the data line (A204) is precharged to a positive potential (ex., 2 V). Further, the select transistor (A205) is turned on, and the source line (A206) is set at 0 V. The first word line (A208) other than the first word line (A201) for driving the memory cell (A202) to be read out, and the second word line (A209) are set at a prescribed high potential (ex., 5 V for all). Further, a prescribed read voltage (ex., 3 V) is applied to the first word line (A201). At this step, when charges are stored in the memory cell from which data is read out, and the threshold voltage is high, a large current does not flow. In consequence, the data line (A204) potential does not show a wide range of variations from the precharge voltage. In contrast, when no charge is stored in the memory cell from which data is to be read out, the threshold voltage is low. Accordingly, a large current flows, so that the global data line (A204) potential largely drops from the precharge voltage. One end of the data line (A204) is connected to a sense amplifier, whereby the voltage variations are amplified to perform reading.

In accordance with the present invention, it is possible to provide a memory element configuration whereby the required voltages are few in kind, and the voltages are low, while ensuring the reliability. By using this memory element, it is possible to simplify the configurations of the peripheral circuits of a semiconductor memory device, and to reduce the chip area. This can implement a low cost semiconductor memory device.

What is claimed is:

1. A semiconductor memory element, comprising:
a channel region comprised of a semiconductor, the channel region including a first channel region which is a part of the channel region, and a second channel region which is a part of the channel region, and different from the first channel region,
a plurality of charge storage regions in the vicinity of the channel region,
a first gate electrode comprised of a metal or a semiconductor for controlling the electric potential of the first channel region, and
a second gate electrode comprised of a metal or a semiconductor for controlling the electric potential of the second channel region,
the electric potential to be applied to the first gate electrode upon writing of data and the electric potential to be applied to the first gate electrode upon erasing of data having the same polarity,
wherein the charge storage regions are comprised of a plurality of independent and electrically isolated microcrystal grains.

2. A semiconductor memory element according to claim 1, wherein the microcrystal grains are comprised of silicon.

3. A semiconductor memory element according to claim 1, wherein the plurality of microcrystal grains have a mean size of 10 nm.

4. A semiconductor memory element according to claim 3, wherein the microcrystal grains are comprised of silicon.

5. A semiconductor memory element according to claim 1, wherein the microcrystal grains are arranged such that a leak path existing on one of the microcrystal grains will not prevent the other microcrystal grain from holding charge.

6. A semiconductor memory element according to claim 5, wherein the microcrystal grains are comprised of silicon.

7. A semiconductor memory element, comprising:
a channel region comprised of a semiconductor, the channel region including a first channel region which is a part of the channel region, and a second channel region which is a part of the channel region, and different from the first channel region,
a plurality of charge storage regions in the vicinity of the channel region,
a first gate electrode comprised of a metal or a semiconductor for controlling the electric potential of the first channel region, and
a second gate electrode comprised of a metal or a semiconductor for controlling the electric potential of the second channel region,
the electric potential to be applied to the first gate electrode upon writing of data and the electric potential to be applied to the second gate electrode upon erasing of data having the same polarity,
wherein the charge storage regions are comprised of a plurality of
independent and electrically isolated microcrystal grains.

8. A semiconductor memory element according to claim 7, wherein the microcrystal grains are comprised of silicon.

9. A semiconductor memory element according to claim 7, wherein the plurality of microcrystal grains have a mean size of 10 nm.

10. A semiconductor memory element according to claim 8, wherein the microcrystal grains are comprised of silicon.

11. A semiconductor memory element according to claim 7, wherein the microcrystal grains arranged such that a leak path existing on one of the microcrystal grains will not prevent the other microcrystal grain from holding charge.

12. A semiconductor memory element according to claim 11, wherein the microcrystal grains are comprised of silicon.

13. A semiconductor memory element, comprising:
a source region,
a drain region,
a channel region comprised of a semiconductor, the channel region including a first channel region which is a part of the channel region, and a second channel region which is a part of the channel region, and different from the first channel region,
the source region and the drain region being connected by the channel region, a plurality of charge storage regions in the vicinity of the channel region, a first gate electrode comprised of a metal or a semiconductor for controlling the electric potential of the first channel region, and a second gate electrode comprised of a metal or a semiconductor for controlling the electric potential of the second channel region, the electric potential to be applied to the first gate electrode upon writing of data and the electric potential to be applied to the first gate electrode upon erasing of data having the same polarity, wherein the charge storage regions are comprised of a plurality of independent and electrically isolated microcrystal grains.

14. A semiconductor memory element according to claim 13,
wherein the microcrystal grains are comprised of silicon.

15. A semiconductor memory element according to claim 13,
wherein the plurality of microcrystal grains have a mean size of 10 nm.

16. A semiconductor memory element according to claim 14,
wherein the microcrystal grains are comprised of silicon.

17. A semiconductor memory element according to claim 13,
wherein the microcrystal grains arranged such that a leak path existing on one of the microcrystal grains will not prevent the other microcrystal grain from holding charge.

18. A semiconductor memory element according to claim 17,
wherein the microcrystal grains are comprised of silicon.

19. A semiconductor memory element, comprising:
a source region,
a drain region,
a channel region comprised of a semiconductor, the channel region including a first channel region which is a part of the channel region, and a second channel region which is a part of the channel region, and different from the first channel region, the source region and the drain region being connected by the channel region, a plurality of charge storage regions in the vicinity of the channel region, a first gate electrode comprised of a metal or a semiconductor for controlling the electric potential of the first channel region, and a second gate electrode comprised of a metal or a semiconductor for controlling the electric potential of the second channel region, the electric potential to be applied to the first gate electrode upon writing of data and the electric potential to be applied to the second gate electrode upon erasing of data having the same polarity, wherein the charge storage regions are comprised of a plurality of independent and electrically isolated microcrystal grains.

20. A semiconductor memory element according to claim 19,
wherein the microcrystal grains are comprised of silicon.

21. A semiconductor memory element according to claim 19,
wherein the plurality of microcrystal grains have a mean size of 10 nm.

22. A semiconductor memory element according to claim 21,
wherein the microcrystal grains are comprised of silicon.

23. A semiconductor memory element according to claim 19,
wherein the microcrystal grains arranged such that a leak path existing on one of the microcrystal grains will not prevent the other microcrystal grain from holding charge.

24. A semiconductor memory element according to claim 23,
wherein the microcrystal grains are comprised of silicon.

* * * * *